United States Patent
Arabshahi et al.

(10) Patent No.: US 11,556,117 B2
(45) Date of Patent: Jan. 17, 2023

(54) REAL-TIME ANOMALY DETECTION AND CLASSIFICATION DURING SEMICONDUCTOR PROCESSING

(71) Applicant: Applied Materials, Inc., Santa Clara, CA (US)

(72) Inventors: Shahab Arabshahi, San Jose, CA (US); Michael Nichols, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 335 days.

(21) Appl. No.: 16/659,557

(22) Filed: Oct. 21, 2019

(65) Prior Publication Data

US 2021/0116896 A1    Apr. 22, 2021

(51) Int. Cl.
| | | |
|---|---|---|
| *G05B 19/418* | (2006.01) | |
| *G06N 3/08* | (2006.01) | |
| *G05B 13/02* | (2006.01) | |
| *G06N 3/04* | (2006.01) | |

(52) U.S. Cl.
CPC ..... *G05B 19/41875* (2013.01); *G05B 13/027* (2013.01); *G06N 3/0445* (2013.01); *G06N 3/08* (2013.01); *G05B 2219/31357* (2013.01); *G05B 2219/32179* (2013.01); *G05B 2219/32193* (2013.01); *G05B 2219/32222* (2013.01); *G05B 2219/32368* (2013.01); *G05B 2219/45031* (2013.01)

(58) Field of Classification Search
CPC . G06N 20/00; G06N 3/08; G06N 3/02; G05B 2219/45031; G05B 19/41875; G05B 23/024; G05B 13/027; G05B 23/0254; G05B 2219/32368; G05B 2219/32194; G05B 2219/32201; G05B 2219/32222; G05B 2219/33296; G05B 2219/34477; G06F 17/18; G06F 11/3447
See application file for complete search history.

(56) References Cited

U.S. PATENT DOCUMENTS

| | | | |
|---|---|---|---|
| 2003/0003607 A1* | 1/2003 | Kagoshima | H01J 37/32935 438/14 |
| 2005/0288812 A1* | 12/2005 | Cheng | G05B 19/41875 700/109 |
| 2018/0347047 A1* | 12/2018 | Hashimoto | H01L 21/02164 |
| 2019/0115267 A1* | 4/2019 | Kabouzi | H01L 21/67253 |
| 2019/0196443 A1* | 6/2019 | Tokorozuki | G05B 19/4184 |
| 2019/0280942 A1* | 9/2019 | Cote | H04W 24/08 |
| 2019/0286983 A1* | 9/2019 | Jung | G06N 3/08 |
| 2019/0346820 A1* | 11/2019 | Kawatake | G05B 19/4184 |

(Continued)

*Primary Examiner* — Darrin D Dunn
(74) *Attorney, Agent, or Firm* — Kilpatrick Townsend & Stockton LLP

(57) ABSTRACT

A method of detecting and classifying anomalies during semiconductor processing includes executing a wafer recipe a semiconductor processing system to process a semiconductor wafer; monitoring sensor outputs from a sensors that monitor conditions associated with the semiconductor processing system; providing the sensor outputs to models trained to identify when the conditions associated with the semiconductor processing system indicate a fault in the semiconductor wafer; receiving an indication of a fault from at least one of the models; and generating a fault output in response to receiving the indication of the fault.

20 Claims, 9 Drawing Sheets

(56) References Cited

U.S. PATENT DOCUMENTS

| | | | |
|---|---|---|---|
| 2019/0385695 A1* | 12/2019 | Jeong | G01R 31/2621 |
| 2020/0101579 A1* | 4/2020 | Suzuki | B24B 51/00 |
| 2020/0104639 A1* | 4/2020 | Didari | G06K 9/6257 |
| 2020/0242511 A1* | 7/2020 | Kale | G06N 20/00 |
| 2021/0042570 A1* | 2/2021 | Iskandar | G06F 11/3089 |

* cited by examiner

REAL-TIME ANOMALY DETECTION AND CLASSIFICATION DURING SEMICONDUCTOR PROCESSING

BACKGROUND

Semiconductor processing systems include an environmentally controlled processing chamber that is used to manufacture semiconductor devices. Typically, a semiconductor wafer may be formed from a semiconductor material, such as silicon, and individual electronic devices are formed in integrated circuits on the wafer. Fabricating a semiconductor wafer is a multi-step sequence of photolithographic and/or chemical processing procedures. These steps may include surface passivation, thermal oxidation, planar diffusion, junction isolation, dry/wet etching, plasma formation, chemical/physical vapor deposition, and so forth. These processes may form electronic circuits that are gradually created on the semiconductor wafer.

Any semiconductor manufacturing process is subject to variations in the process that may result in latent defects being formed in the semiconductor wafer. When conditions in the processing chamber deviate even small amounts from the ideal conditions, abnormalities may be introduced in the physical structure of the wafer that manifest as faults in the operation of the electronic circuits on the semiconductor wafer. These faults are typically not identified until after the manufacturer of the semiconductor wafer has been completed when the wafer undergoes production testing. After manufacturing is complete, the electronic circuits on the wafer may be tested to determine whether any faults were introduced during the manufacturing process. Faults that are introduced early in the manufacturing process may ruin a wafer, however that wafer is usually still subject to each remaining step in the manufacturing process. Each step after a fault has been introduced represents wasted time, material, and manufacturing space in the semiconductor processing chamber.

SUMMARY

In some embodiments, a method of detecting and classifying anomalies during semiconductor processing may include executing a wafer recipe that includes control inputs and timing constraints for a semiconductor processing system to process a semiconductor wafer. The method may also include, while the wafer recipe is executing, monitoring a plurality of sensor outputs from a plurality of sensors that monitor conditions associated with the semiconductor processing system. The method may additionally include providing the plurality of sensor outputs to a plurality of models. The plurality of models may be trained to identify when the conditions associated with the semiconductor processing system indicate a fault in the semiconductor wafer. The method may further include receiving an indication of a fault from at least one of the plurality of models; and generating a fault output in response to receiving the indication of the fault.

In some embodiments, a non-transitory machine-readable medium may include instructions that, when executed by one or more processors, cause the one or more processors to perform operations including executing a wafer recipe that includes control inputs and timing constraints for a semiconductor processing system to process a semiconductor wafer. The operations may also include, while the wafer recipe is executing, monitoring a plurality of sensor outputs from a plurality of sensors that monitor conditions associated with the semiconductor processing system. The operations may additionally include providing the plurality of sensor outputs to a plurality of models. The plurality of models may be trained to identify when the conditions associated with the semiconductor processing system indicate a fault in the semiconductor wafer. The operations may further include receiving an indication of a fault from at least one of the plurality of models; and generating a fault output in response to receiving the indication of the fault.

In some embodiments, a semiconductor processing system may include a processing chamber, one or more processors, and one or more memory devices including instructions that, when executed by the one or more processors, cause the one or more processors to perform operations including executing a wafer recipe that includes control inputs and timing constraints for a semiconductor processing system to process a semiconductor wafer. The operations may also include, while the wafer recipe is executing, monitoring a plurality of sensor outputs from a plurality of sensors that monitor conditions associated with the semiconductor processing system. The operations may additionally include providing the plurality of sensor outputs to a plurality of models. The plurality of models may be trained to identify when the conditions associated with the semiconductor processing system indicate a fault in the semiconductor wafer. The operations may further include receiving an indication of a fault from at least one of the plurality of models; and generating a fault output in response to receiving the indication of the fault.

In any embodiments, any of the following features may be implemented in any combination and without limitation. The method/operations may also include executing a second wafer recipe to process a second semiconductor wafer; while the second wafer recipe is executing, monitoring the plurality of sensor outputs from the plurality of sensors that monitor the conditions associated with the semiconductor processing system; providing the plurality of sensor outputs to the plurality of models; and receiving no indications of a fault from any of the plurality of models. The method/operations may additionally include receiving an indication that the second semiconductor wafer comprises a fault. The method/operations may also include repeatedly executing the second wafer recipe for a threshold number of executions to generate training data after receiving the indication that the second semiconductor wafer comprises the fault. The method/operations may additionally include accessing data from a threshold number of executions of the second wafer recipe to use as training data after receiving the indication that the second semiconductor wafer comprises the fault. The method/operations may also include providing the data from the threshold number of executions of the second wafer recipe to train a new model for recognizing the fault. The method/operations may further include providing the new model to the plurality of models for processing sensor outputs during subsequent executions of wafer recipes. The a model in the plurality of models may include a multi-layer neural network. The model may include a recurrent neural network (RNN). The RNN may include comprises a long short-term memory (LSTM). Generating the fault output in response to receiving the indication of the fault may include generating an error message displayed on a user interface of the semiconductor processing system. The plurality of sensor outputs may be provided to the plurality of models in real time as the wafer recipe is executed. The plurality of models may process the plurality of sensor outputs as the wafer recipe is executed. A model in the plurality of models may provide inputs corresponding to each of the plurality of sensor outputs; a normal output indicating an absence of a detected fault; and an abnormal output indicating a detected fault. The wafer recipe may include one or more setpoint temperatures with associated times and one or more setpoint pressures with associated times. The wafer recipe may cause the semiconductor processing system to perform an etch process on the semiconductor wafer. The plurality of sensor outputs may include a temperature in the processing chamber, a pressure in the processing chamber, and measurements of gas flows into the processing chamber. The fault may include a physical defect in the semiconductor wafer introduced by conditions in the processing chamber.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an FIG. 1 illustrates a block diagram of a semiconductor processing system, according to some embodiments.

DETAILED DESCRIPTION

Described herein are embodiments for detecting and classifying anomalies during semiconductor processes. Instead of waiting until the end of a manufacturing process to test a wafer for latent defects, the embodiments described herein may use a model-based analysis of sensor outputs during the manufacturing process to identify conditions in the chamber that have previously resulted in wafer defects. As a wafer recipe is executed, sensor outputs may be monitored by a control system. Each of the sensor outputs may be fed into a plurality of models that have been trained to recognize sensor output combinations, or "fingerprints" that indicate that a fault is likely being introduced in a wafer in the chamber. When one of the models indicates a fault condition, a fault output or error message may be generated by the processing system.

In some cases, a pattern of sensor outputs might not correspond to any of the known abnormal combinations of sensor outputs known to generate a fault condition. However, when a fault is later identified in the wafer, the wafer recipe that caused the fault may be run repeatedly to generate training data for a new model. When a sufficient number of normal and/or abnormal data sets have been generated for the wafer recipe, the data sets may be labeled as normal or abnormal and may be provided to train a new model. For example, these labeled data sets may be provided to a neural network, such as a recurrent neural network to train the weights between internal layers of the neural network to correctly distinguish between normal and abnormal sensor conditions. The new model may then be provided to the processing system to be compared against subsequent runs of the wafer recipe such that similar chamber conditions may be identified as fault conditions.

In the following discussion, an example of a semiconductor processing system may first be presented. The semiconductor processing system may include a processor-based processing system that monitors sensor outputs, processes the sensor outputs using previously trained models, and generates indications of fault conditions. Afterwards, specific operations performed by the processing system may be described for detecting and classifying anomalies during the semiconductor process and for training new models used to analyze subsequent executions of a wafer recipe.

Figure 1:
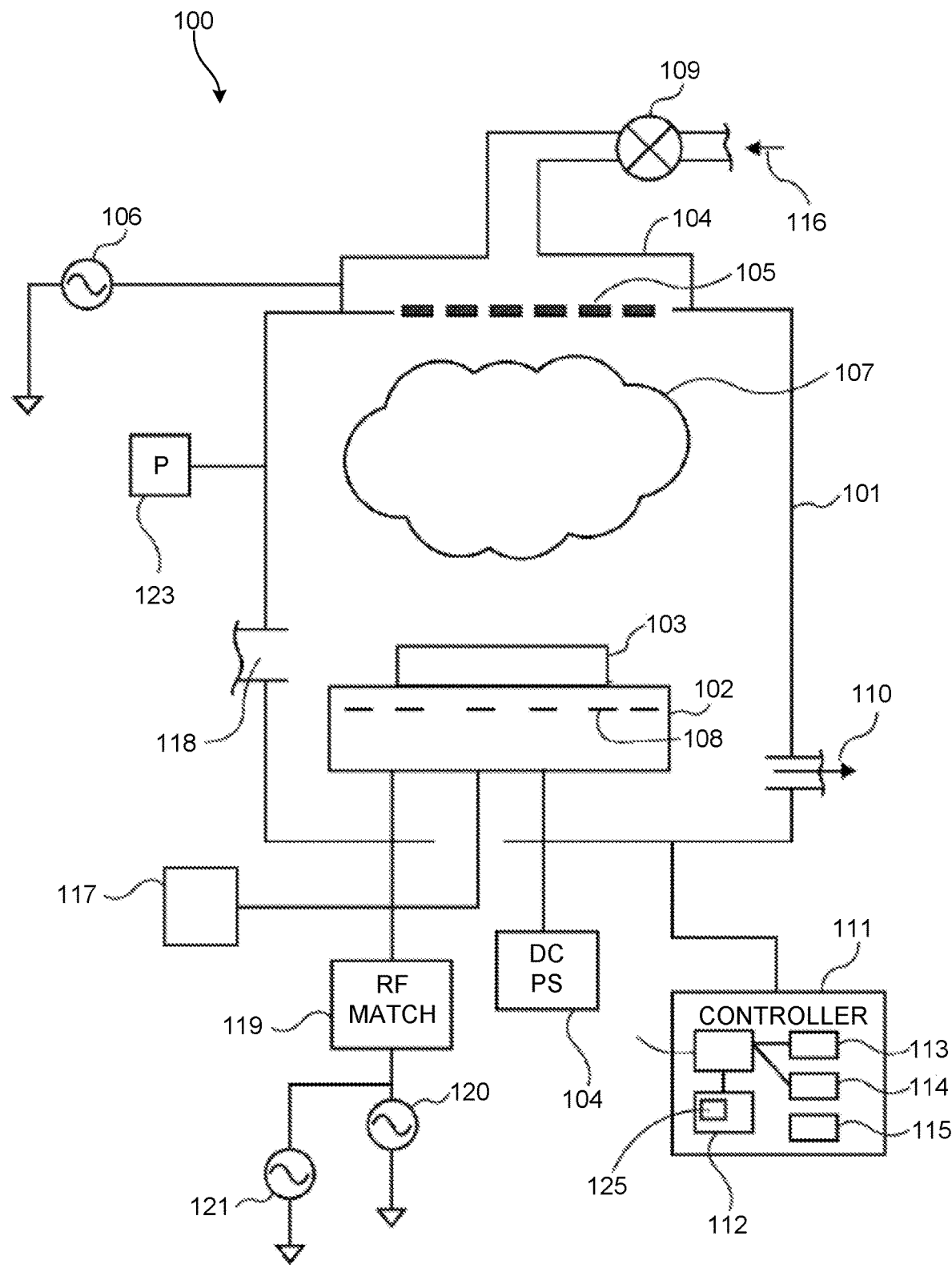

FIG. 1 illustrates a block diagram of an semiconductor processing system 100, according to some embodiments. As shown in FIG. 1, system 100 may include a processing chamber 101. A movable pedestal 102 to hold a workpiece 103 may be placed in processing chamber 101. Pedestal 102 may include an electrostatic chuck ("ESC), a DC electrode 108 embedded into the ESC, and/or a cooling/heating base. In some embodiments, pedestal 102 may act as a moving cathode. In some embodiments, the ESC may include an $Al_2O_3$ material, $Y_2O_3$, or other available ceramic materials known to one of ordinary skill of electronic device manufacturing. A DC power supply 104 may be connected to the DC electrode 108 of the pedestal 102.

As shown in FIG. 1, a workpiece 103 may be loaded through an opening 118 and placed on pedestal 102. Work piece 103 may include a semiconductor wafer, e.g., silicon, germanium, or any other semiconductor wafer. In some embodiments, workpiece 103 may include any material to make any of integrated circuits, passive (e.g., capacitors, inductors) and active (e.g., transistors, photo detectors, lasers, diodes) microelectronic devices. Workpiece 103 may include insulating materials that separate such active and passive microelectronic devices from a conducting layer or layers that are formed on top of them. In some embodiments, workpiece 103 may include a silicon substrate that may include one or more dielectric layers e.g., silicon dioxide, silicon nitride, sapphire, and other dielectric materials. In some embodiments, workpiece 103 may include a wafer stack comprising one or more layers. The one or more layers of the workpiece 103 may include conducting, semiconducting, insulating, or any combination thereof layers.

System 100 may include an inlet to input one or more process gases 116 through a mass flow controller 109 to a plasma source 104. A plasma source 104 comprising a showerhead 105 may be coupled to the processing chamber 101 to receive one or more gases 116 to generate a plasma 107. Plasma source 104 may be coupled to a RF source power 106. Plasma 107 may be generated using a high frequency electric field. Generally, plasma 107 may include plasma particles, such as ions, electrons, radicals, or any combination thereof. In some embodiments, power source 106 may supply power from about 100 W to about 3000 W at a frequency from about 2.0 MHz to about 162 MHz to generate plasma 107.

A plasma bias power 120 may be coupled to the pedestal 102 (e.g., a cathode) via a RF match 119 to energize the plasma. In some embodiments, the plasma bias power 120 may provide a bias power that is not greater than 1000 W at a frequency between about 2 MHZ to 60 MHz, and in a particular embodiment at about 13 MHz. A plasma bias power 121 may also be provided, for example, to provide another bias power that is not greater than 1000 W at a frequency from about 2 MHZ to about 60 MHz, and in a particular embodiment, at about 13.56 MHz. Plasma bias power 120 and bias power 121 may be connected to RF match 119 to provide a dual frequency bias power. In some embodiments, a total bias power applied to the pedestal 102 may be from about 5 W to about 3000 W.

As shown in FIG. 1, a pressure control system 123 may provide a pressure to processing chamber 101. As shown in FIG. 1, chamber 101 may have one or more exhaust outlets 110 to evacuate volatile products produced during processing in the chamber. In one embodiment, plasma system 100 may be an inductively coupled plasma (ICP) system. In another embodiment, plasma system 100 may be a capacitively coupled plasma (CCP) system.

A control system 111 may be coupled to the chamber 101. The control system 111 may include a processor 124, a monitoring system 113, a temperature controller 114, a memory 112 and input/output devices 115 to provide a processing system, as described herein.

Figure 2:
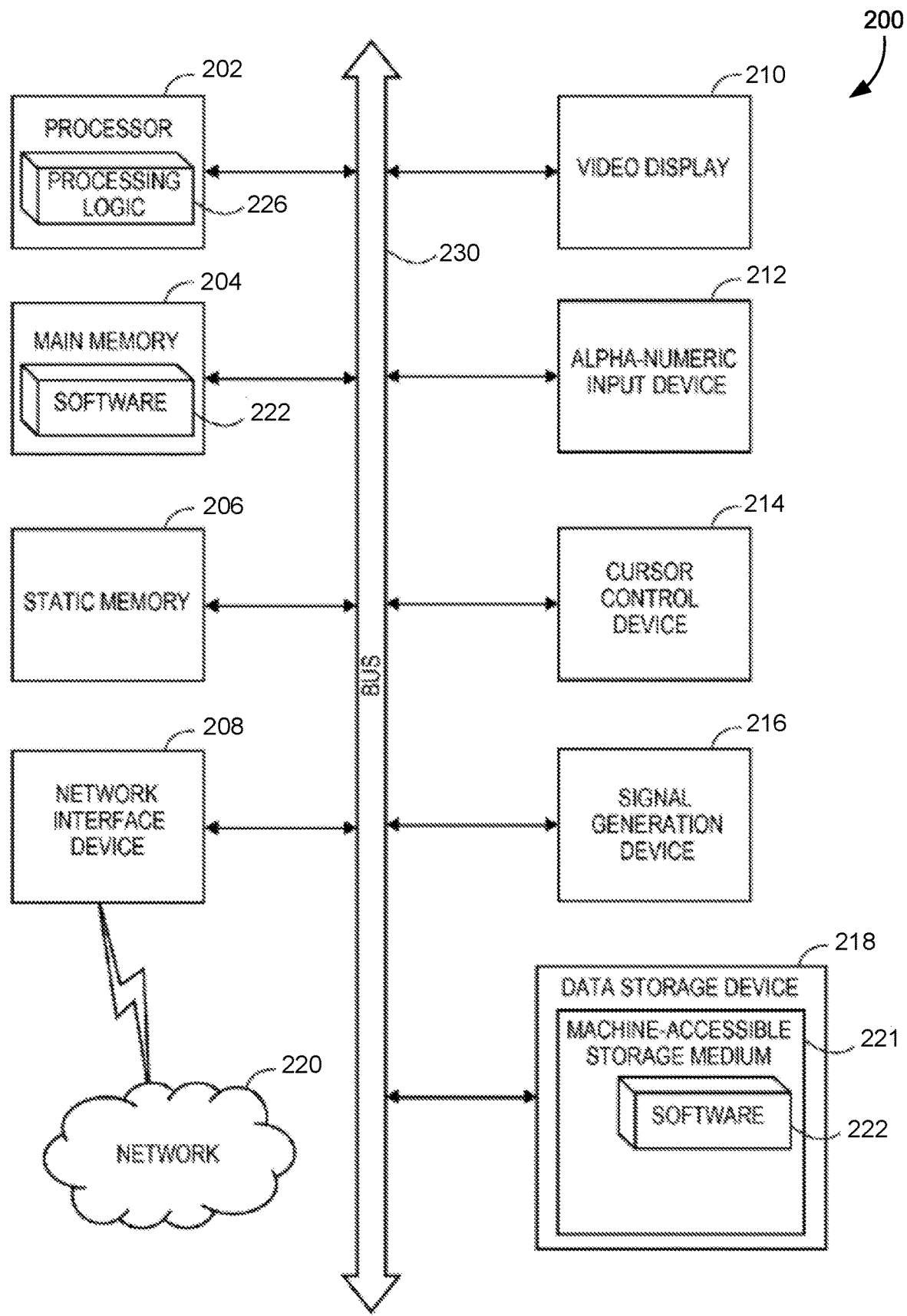
FIG. 2 illustrates a block diagram of a processing system, according to some embodiments.

FIG. 2 illustrates a block diagram of a processing system 200, according to some embodiments. Data processing system processing 200 control system 111 or any other data processing system to provide a processing tool, as described herein with respect to the figures and description below. Specifically, the embodiments described below include software operations that may be executed by this processing system in FIG. 2. In some embodiments, the data processing system 200 may be connected (e.g., networked) to other machines in a Local Area Network (LAN), an intranet, an extranet, or the Internet. The data processing system 200 may operate in the capacity of a server or a client machine in a client-server network environment, or as a peer machine in a peer-to-peer (or distributed) network environment.

The data processing system 200 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that data processing system. Further, while only a single data processing system is illustrated, the term "data processing system" shall also be understood to include any collection of data processing systems that individually or jointly execute a set (or multiple sets) of instructions to perform any one or more of the methodologies described herein.

The data processing system 200 may include a processor 202, a main memory 204 (e.g., read only memory (ROM), flash memory, dynamic random access memory (DRAM) such as synchronous DRAM (SDRAM) or Rambus DRAM (RDRAM), etc.), a static memory 206 (e.g., flash memory, static random access memory (SRAM), etc.), and a secondary memory 218 (e.g., a data storage device) that communicate with each other via a bus 230.

Processor 202 represents one or more processing devices, such as a microprocessor, central processing unit, or other processing device. For example, the processor 202 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 202 may also be one or more special-purpose processing devices such as an application specific integrated circuit (ASIC), a field programmable gate array (FPGA), a digital signal processor (DSP), network processor, or the like. Processor 202 may be configured to control processing logic 226 for performing the operations described below.

The computer system 200 may further include a network interface device 208. The computer system 200 also may include a video display unit 210, an alphanumeric input device 212 (e.g., a keyboard), a cursor control device 214 (e.g., a mouse), and a signal generation device 216 (e.g., a speaker).

The secondary memory 218 may include a machine-accessible storage medium (or more specifically a computer-readable storage medium) 221 on which is stored one or more sets of instructions (e.g., software 222) embodying any one or more of the methodologies or functions described herein. The software 222 may also reside, completely or at least partially, within the main memory 204 and/or within the processor 202 during execution thereof by the data processing system 200, the main memory 204 and the processor 202 also constituting machine-readable storage media. The software 222 may further be transmitted or received over a network 220 via the network interface device 208.

While the machine-accessible storage medium 221 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies described herein. The term "machine readable storage medium" shall accordingly be taken to include, but not be limited to, solid-state memories, and optical and magnetic media.

Faults may be introduced into a semiconductor wafer by way of many different mechanisms, including latent defects in the semiconductor material itself. As a wafer is processed in various processing chambers throughout the manufacturing process, faults may also be introduced by small variations in those processes. The environmental conditions inside a processing chamber may need to be tightly controlled to correctly form the circuits and patterns on the wafer as desired. Small variations in temperature, pressure, gas flow rate, and/or any other environmental conditions may cause faults to be introduced in the circuits on the wafer. These faults may cause the circuits to function outside of the desired operating parameters, or in some cases, to not function at all.

When a fault is introduced in a stage of the wafer manufacturing process, the fault is often not detected until the manufacturing is complete and the circuit is tested. Therefore, when a fault is introduced into the wafer early in the manufacturing process, the rest of the time spent manufacturing wafer may be considered wasted. If faults could instead be detected early in the manufacturing process as they are introduced, this could save valuable time and resources and help process engineers gain a greater understanding of conditions that cause faults in semiconductor wafers.

Figure 3:
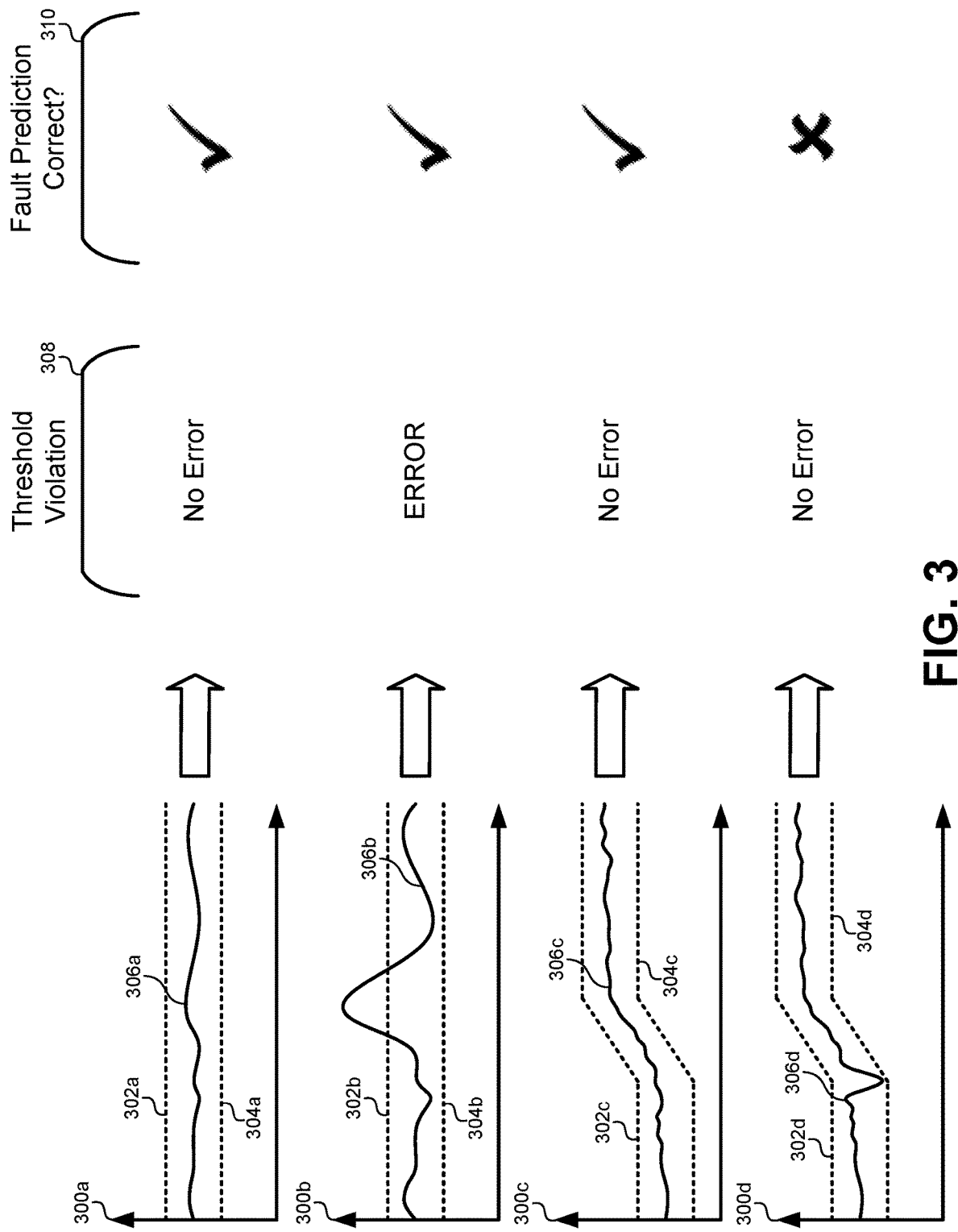
FIG. 3 illustrates a fault detection process using standard numerical thresholds.

FIG. 3 illustrates a fault detection process using standard numerical thresholds. One method of detecting faults that may be used during the manufacturing process is to monitor environmental conditions in the processing chamber and compare them to desired thresholds throughout the manufacturing process. FIG. 3 illustrates graphs 300 showing various sensor outputs 306 during a stage of a manufacturing process. Each of the various sensor outputs 306 may be compared to an upper threshold 302 and/or a lower threshold 304. This error detection mechanism may constantly monitor the sensor outputs 306 and compare them to the thresholds 302, 304 during the processing stage. If the sensor outputs 306 drift outside of the thresholds 302, 304, then an error may be detected.

While comparing the sensor outputs 306 to the thresholds 302, 304 may identify some environmental conditions that may cause faults in the wafer, this method is susceptible to both false positives and false negatives. For example, each graph 300 includes a determination of a threshold violation 308 and an indication of whether the threshold violation correctly predicted a fault 310 in the wafer. Graph 300a and graph 300c illustrate simple cases where the sensor outputs 306a and 306c stay within the corresponding thresholds such that no error is detected and no wafer fault is introduced. Graph 300b illustrates a case where the sensor output 306b does exceed a threshold 302b, and a fault is correctly predicted as the error is recorded. The sensor output 306d in graph 300d never violates its thresholds 302d, 304d. However, it includes a sharp but small deviation from its desired smooth output. This deviation is not sufficient to violate the threshold 304d, but it is sharp enough to cause a fault to be introduced in the wafer. No threshold violation 308 is detected by the threshold detection process, and thus a fault is not correctly predicted 310 in the wafer using this technique.

The embodiments described herein solve the technical problem of detecting faults in a wafer manufacturing process as they are introduced. These embodiments improve on simple threshold detection by instead using a model-based holistic comparison of the sensor outputs in the processing chamber to trained "fingerprints" of sensor outputs that are known to produce faults. These embodiments analyze the sensor outputs in real time as they are received and processes outputs through a plurality of pre-trained models to identify conditions that indicate environmental conditions in the processing chamber that may introduce a fault into the semiconductor wafer.

Figure 4:
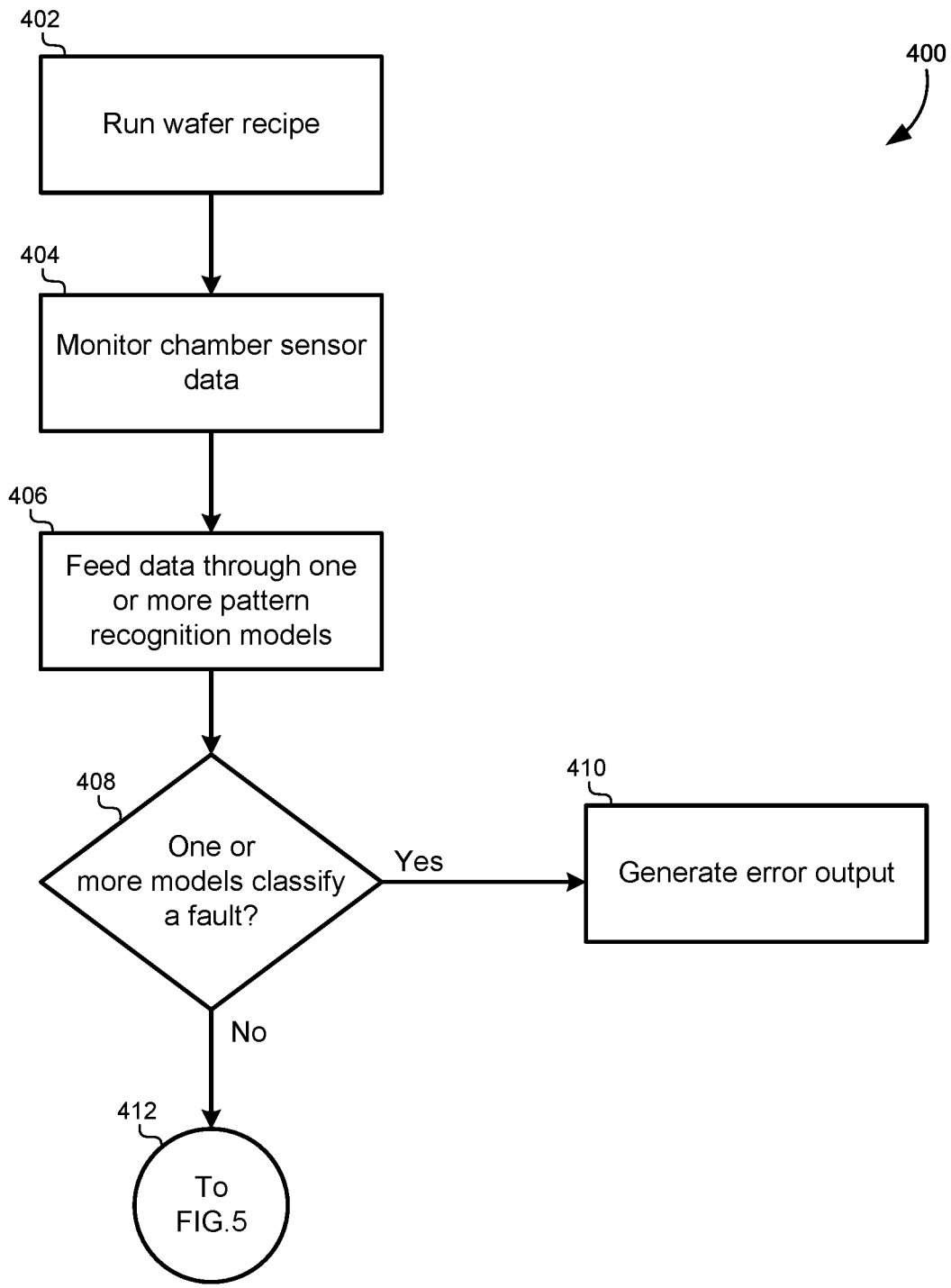
FIG. 4 illustrates a flowchart of a method for detecting faults using a model-based approach, according to some embodiments.

FIG. 4 illustrates a flowchart of a method for detecting faults using a model-based approach, according to some embodiments. The method may include executing a wafer recipe (402). As used herein, the term "wafer recipe" may include a set of control inputs and/or timing constraints that control a semiconductor processing system during a processing stage for a semiconductor wafer. For example, using the semiconductor processing system above in FIG. 1, a semiconductor wafer may be placed in the processing chamber for a specific step in the manufacturing process. By way of example, this step may include a semiconductor etch process to remove material previously deposited on the wafer. The wafer recipe includes the set of inputs that control the environmental conditions in the processing chamber during this step. For example, the wafer recipe may include setpoint values and associated times that control how environmental conditions change throughout the processing step. Wafer recipes may include a time series of setpoint temperatures, a time series of setpoint pressures, a time series of gas flow rates into the processing chamber, a time series of gas flow ratios, and/or setpoints for any other environmental condition that may be controlled in the processing chamber. Other inputs provided by a wafer recipe may include an endpoint algorithm, setpoints for one or more different RF generators (e.g., power, pulse frequency, duty cycle, etc.), input gas types and flow rates, electrostatic chuck temperature and/or voltage setpoints, backside helium pressure setpoints, temperature setpoints for various chamber elements (e.g. chamber body, cathode, etc.) and/or any other setting for defining environmental conditions of the chamber during a process.

The method may also include monitoring a plurality of sensor outputs while the wafer recipe is executed (404). As described above, the processing chamber may include a plurality of sensors that measure environmental characteristics of the processing chamber. In some systems, the plurality of sensors may be configured to monitor conditions controlled by the inputs provided by the wafer recipe. For example, when the wafer recipe includes a time series of setpoint temperatures, the plurality of sensors may include one or more temperature sensors that are located around the processing chamber to measure the resulting temperatures in the chamber as they are controlled by the wafer recipe. Other sensors may include multiple sensors within different sensor categories at different locations both inside and outside the chamber. Different sensor categories may include pressure sensors, gas flow sensors, optical emission spectrum sensors, RF emission sensors, voltage sensors, current sensors, position sensors, and/or any other sensors used in semiconductor processing systems.

The sensors may be monitored in real time as the wafer is being processed and the wafer recipe is executed. As used herein, the term "real-time" refers to a limit on the delay between when a sensor output is received from a sensor and when that output is processed by a model. This delay may be less than 10 seconds, such that the outputs of the sensors are continually processed throughout the execution of the wafer recipe. As sensors are read by the processing system, each sensor reading may be associated with a timestamp, such that the timing of different physical characteristics of the processing chamber may be recorded and provided to the model. As described below, some embodiments may use models with internal memories using feedback connections to process sequences of data provided over time.

The method may additionally include feeding data through one or more pattern recognition models (406). For example, the system may provide sensor outputs from the sensors to the models. The models may include different inputs that correspond to the sensor outputs. Specific models described below may be used that are configured to receive sensor outputs as a sequence of data points over time as they are read from the sensors. For example, as new values are sampled from the sensors by the processing system, these values can be immediately forwarded to the inputs of the models for processing.

A plurality of models may be used, such that the outputs of the sensors are forwarded to multiple models simultaneously for processing. As described below, each model may be trained to recognize a particular pattern of sensor outputs, or "fingerprint," that indicates a fault is likely being generated in the semiconductor wafer. Therefore, each of the plurality of models may be trained to identify when conditions associated with the semiconductor processing system indicate that a fault is likely to be formed. This fault may be caused by environmental conditions in the processing chamber.

As the models are continually processing outputs from the sensors, the models may also continually provide outputs indicating abnormal or normal conditions in the processing chamber. In some embodiments, each model may include an output indicating a detected fault condition as well as an output indicating the absence of a detected fault. The processing system may monitor the outputs of the models and identify whether any model detects a fault condition at any point during the execution of the wafer recipe (408).

If a model outputs an indication of abnormal conditions that may indicate a fault, the processing system may generate a fault output (410). This may also be referred to as an error output. The fault output may take many forms depending on the embodiment. In some embodiments, the fault output may include causing a visual/textual/numerical indication to be displayed on a user interface of the semiconductor processing system. For example, a warning may be displayed to a user, and the user interface may indicate the sensor outputs that caused the default output. In some embodiments, the fault output may also include writing a fault indication in a process log, sending a record of the sensor measurements to a data store for analysis and/ remodel training, stopping the process being executed by the wafer recipe, sounding an alarm, and/or any other method of alerting users and/or other systems of the possible fault condition.

If the entire wafer recipe is executed without any of the models generating an indication of a fault, the manufacturing process for the semiconductor wafer may continue as normal. For example, the wafer may undergo a subsequent process in the same processing chamber using a different wafer recipe. Alternatively, the wafer may be moved to a new processing chamber and undergo a separate process. Each of these processes may execute their own model-based fault detection system as described for the current wafer recipe. However, the fact that no fault was detected at this stage does not guarantee that no fault condition was caused during the execution of the current wafer recipe. Instead, this only indicates that no model has yet been trained to recognize any fault conditions that may have occurred during the current wafer recipe. Therefore, some embodiments may perform subsequent analysis of the sensor outputs to determine whether an undetected "fingerprint" of sensor outputs should be learned by a new model (412).

Figure 5:
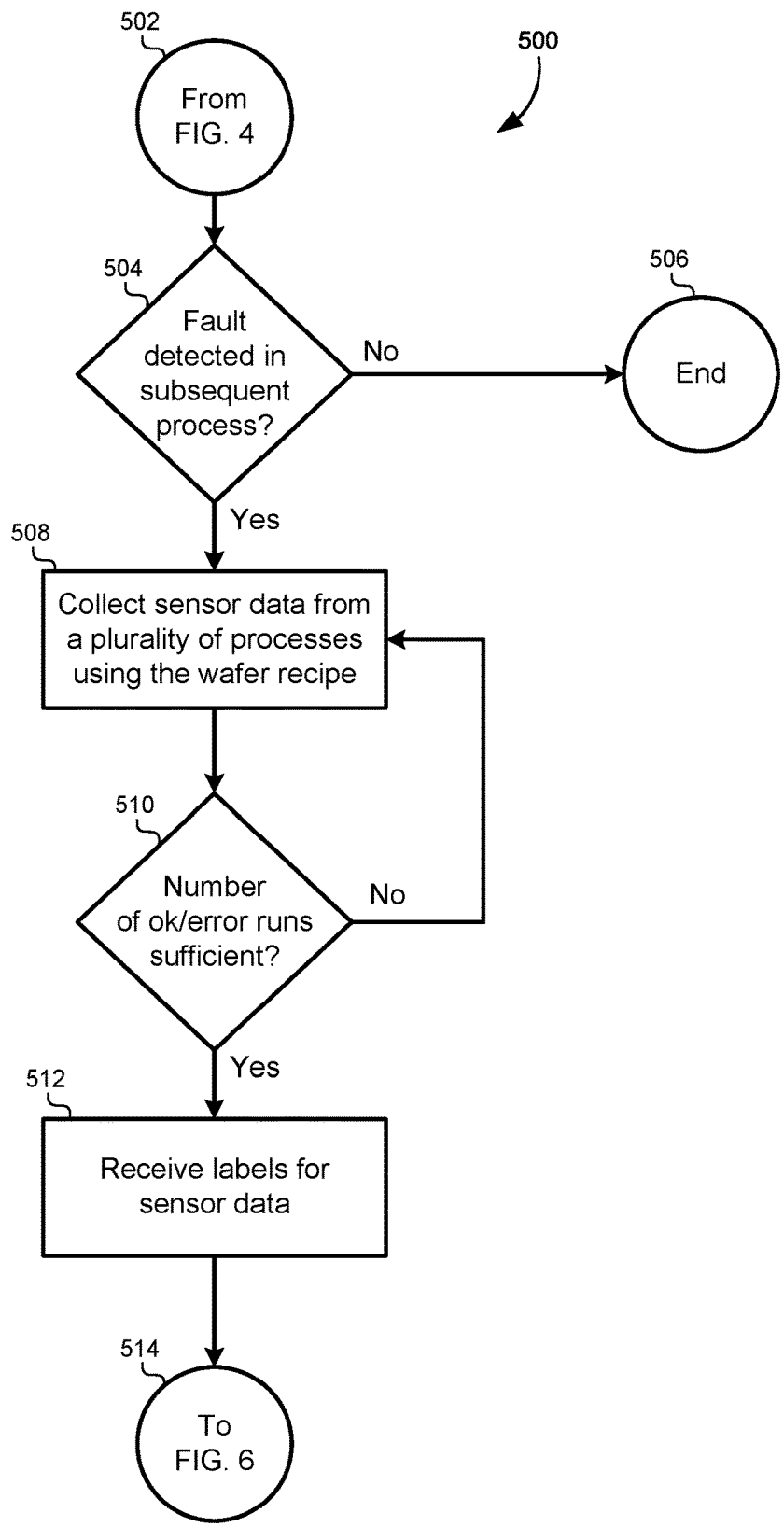
FIG. 5 illustrates a flowchart of a method for determining whether a new model should be trained, according to some embodiments.

FIG. 5 illustrates a flowchart 500 of a method for determining whether a new model should be trained, according to some embodiments. This flowchart 500 may continue from FIG. 4 when a wafer recipe is executed without any models indicating a fault condition (502). The method may include determining whether a fault is present in the semiconductor wafer (504). If no fault exists and the wafer functions normally, the sensor data from the wafer recipe execution may be discarded and/or stored in a data store (506).

However, when a fault is detected, the sensor data may be used to detect and classify similar faults in the future. This fault may be detected at any subsequent point in the wafer manufacturing process. For example, the fault may be detected during production testing, during electronic testing, during visual inspection, during a subsequent deposition/ etch process, and/or during any other process in the manufacturing pipeline. Depending on the type of fault, the location on the wafer, and the other steps in the manufacturing process, it may be determined that the fault likely occurred during the execution of the current wafer recipe. As described above, the sensor outputs can be stored as a time series of sensor measurements. Thus, the conditions that likely cause the fault have been saved by the processing system. After determining that these conditions caused a fault in the semiconductor wafer, the same conditions can be used to begin training a new model to recognize when such conditions exist in the future.

A sufficient amount of data may be required to train a model to recognize the conditions that cause the fault. The method may include collecting sensor data from a plurality of processes using the wafer recipe (508). In some cases, the sensor data may be collected from previous runs of the wafer recipe. For example, when no fault is detected in the semiconductor wafer (506), the sensor data may continue to be stored in a data store and accessed later when the same wafer recipe does result in a fault condition. Therefore, some embodiments may use stored data from previous successful/ unsuccessful executions of the wafer recipe. Some embodiments may begin storing subsequent batches of sensor data for the wafer recipe after the first fault is detected. The stored sensor data from multiple subsequent executions of the wafer recipe may be used to gradually build up a training data set sufficient to train the new model. Some embodiments may alternatively or additionally cause a session of marathon training to be executed where the wafer recipe is run repeatedly to generate sensor outputs for training data.

The method may further include determining whether the number of successful and/or unsuccessful runs of the wafer recipe exceeds a threshold amount required for model training (510). Depending on the model, a certain number of training data sets may be required. This threshold may be set based on the model type and the size of the output data sets from the sensors. Some embodiments may compare a number of executions of the wafer recipe that did not result in a fault with a first threshold. Some embodiments may also compare a number of executions of the wafer recipe that did result in a fault with a second threshold. When either and/or both of these thresholds are met, the data set for training the model may be considered to be of sufficient size. If a sufficient number of data sets have not been received, the system can continue requiring new collections of sensor data by executing the wafer recipe as described above (508).

When a sufficient number of training data sets have been received, the method may include receiving labels for the sensor data 512. Annotating the training data for a model includes classifying each of the data sets of sensor outputs as generating a fault or not generating a fault. This may be done manually by a human operator indicating which executions of the wafer recipe resulted in a fault after observing downstream testing of the semiconductor wafer. This may also be performed automatically. For example, as downstream testing of the semiconductor wafer is automated (e.g., production testing, electronic testing of circuits on the wafer, etc.), the testing systems may provide an indication that a fault was generated in a particular wafer. The processing system may then identify a stored data set of sensor outputs and annotate that data set as causing a fault. Other data sets may remain un-annotated to indicate the absence of a fault. At this point, the training data sets may be sufficient to train a new model, and a new model may be prepared and trained as described below (514).

Figure 6:
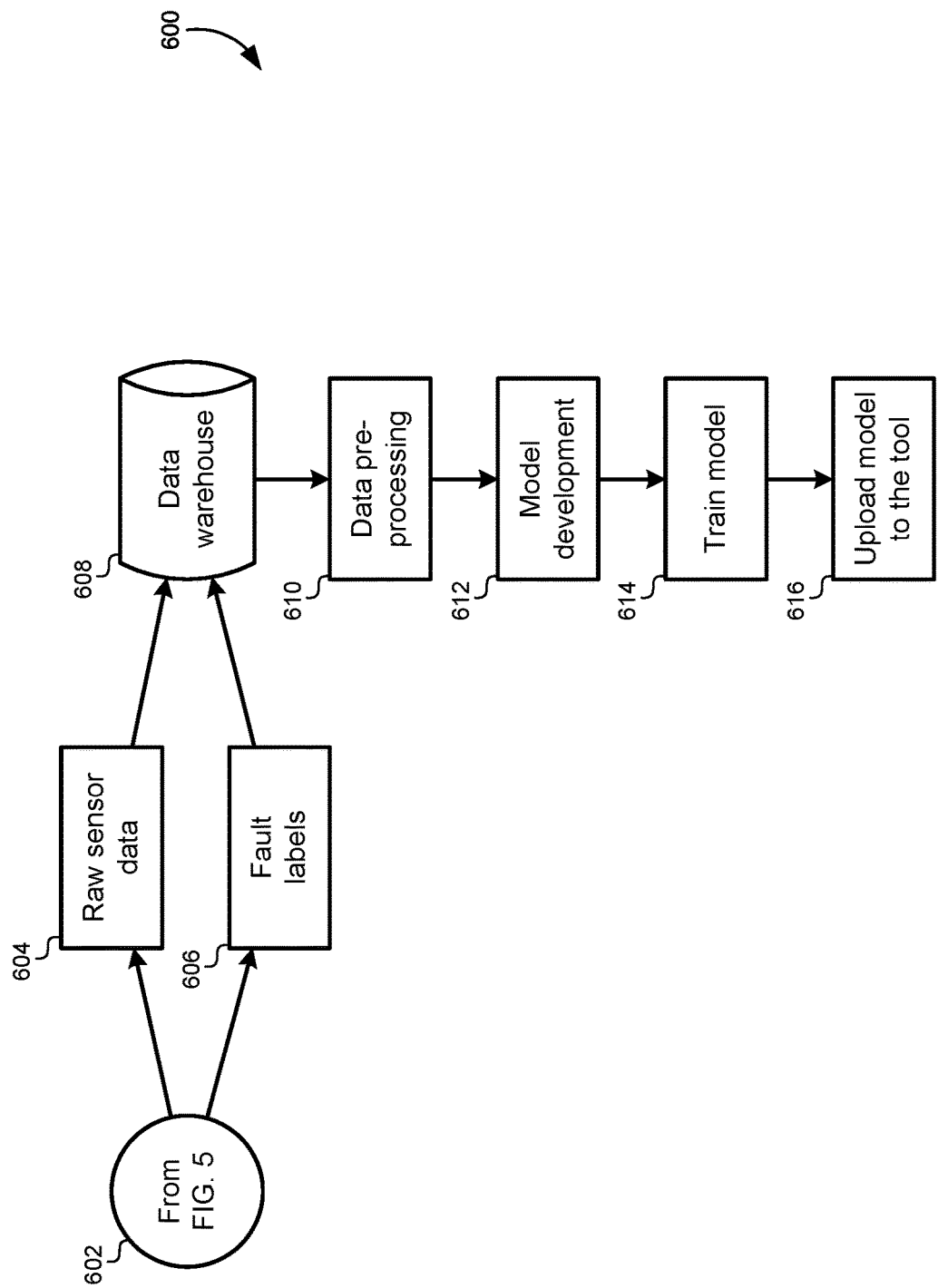
FIG. 6 illustrates a flowchart of a method for training a new model, according to some embodiments.

FIG. 6 illustrates a flowchart 600 of a method for training a new model, according to some embodiments. This flowchart 600 may continue from FIG. 5 (602) after a training data set of sensor outputs has been acquired. As described above, the raw sensor data (604) and the labels (606) of whether the corresponding data set resulted in a fault may be stored in a data warehouse (608) over time and may be indexed according to wafer recipe. To train a new model, the method may include a step of data preprocessing (610). This may include reformatting the raw sensor outputs into a time sequence of inputs to be provided to the model for training. For example, the data preprocessing stage may include cleaning the data, resampling the data, reformatting the data, and/or curating the data to make it compatible with training a new model.

The method may next include determining a type of model to use for a particular fingerprint (612). In some embodiments, a particular type of model known as a neural network may be used. A neural network is a network or circuit of artificial neurons or nodes that can be trained to solve artificial intelligence problems. The connections between neurons may be modeled using weights associated with each connection. These weights may be trained by submitting each of the training data sets to the neural network. The weights may be adjusted to generate the correct output, which corresponds to the data set labels (e.g., fault, no-fault) assigned above. The neural network may use what is known as "deep learning" to refine the weights and connections between nodes over time as more data is received. As depicted below, the neural network may include many hidden layers, and the number of layers may depend on the needs of the particular embodiments.

Some embodiments may use a particular type of neural network known as a recurrent neural network (RNN). An RNN comprises a class of artificial neural networks where connections between nodes form a directed graph along a temporal sequence. This allows the neural network to handle temporal dynamic behavior. Unlike simple neural networks, RNNs may include a saved internal state that processes sequences of inputs. As described above, the outputs from the sensors of the processing chamber may be analyzed and fed into the model in real time as they are received. This generates a time sequence of inputs that may be analyzed sequentially as a temporal sequence within the model. The RRN uses its internal state memory to recognize current conditions as well as previous conditions that indicate a changing trajectory of sensor values. In some embodiments, the model may use a Long-Short Term Memory (LSTM) model, which represents an artificial neural network designed as an RNN as described above. The LSTM network may be well suited for classifying, processing, and making predictions based on time series data because the LSTM may be designed to handle gaps between important events in a time series.

Note that the use of the RNN and the LSTM neural networks is provided only by way of example and is not meant to be limiting. Other embodiments may use other types of models in addition to these particular neural networks described herein.

The method may further include training a model using the sensor data (614). In some embodiments, a new LSTM model may be generated with some pre-tuned parameters. The new model may be specifically trained using techniques to recognize the "fingerprint" of sensor outputs that indicate a fault condition is likely. This training may use the data sets of sensor outputs collected in the process described above. The weights/connections between nodes and internal hidden layers of the neural network may be adjusted to create a best fit between the data set and the desired output results. Once the model is trained, the internal weights/connections may be configured to receive a new batch of sensor outputs in a time series and determine whether they match the trained "fingerprint" of previous fault conditions.

Once the new model is trained, it may be uploaded to the processing system of the tool (e.g., the semiconductor processing system) to be used in subsequent executions of that wafer recipe. This process described in FIGS. 5-6 allows the system to adaptively provide new models over time as faults are detected later in the semiconductor wafer manufacturing pipeline. Additionally, each time the wafer recipe is executed, the resulting data set from the sensor outputs can be labeled and used to continuously train and retrain the model. This allows the "fingerprint" represented by the model to be further refined over time until it precisely matches the conditions caused by the wafer recipe that results in a fault. By continually training the model over time, the number of false positives and/or false negatives may be dramatically reduced.

Figure 7:
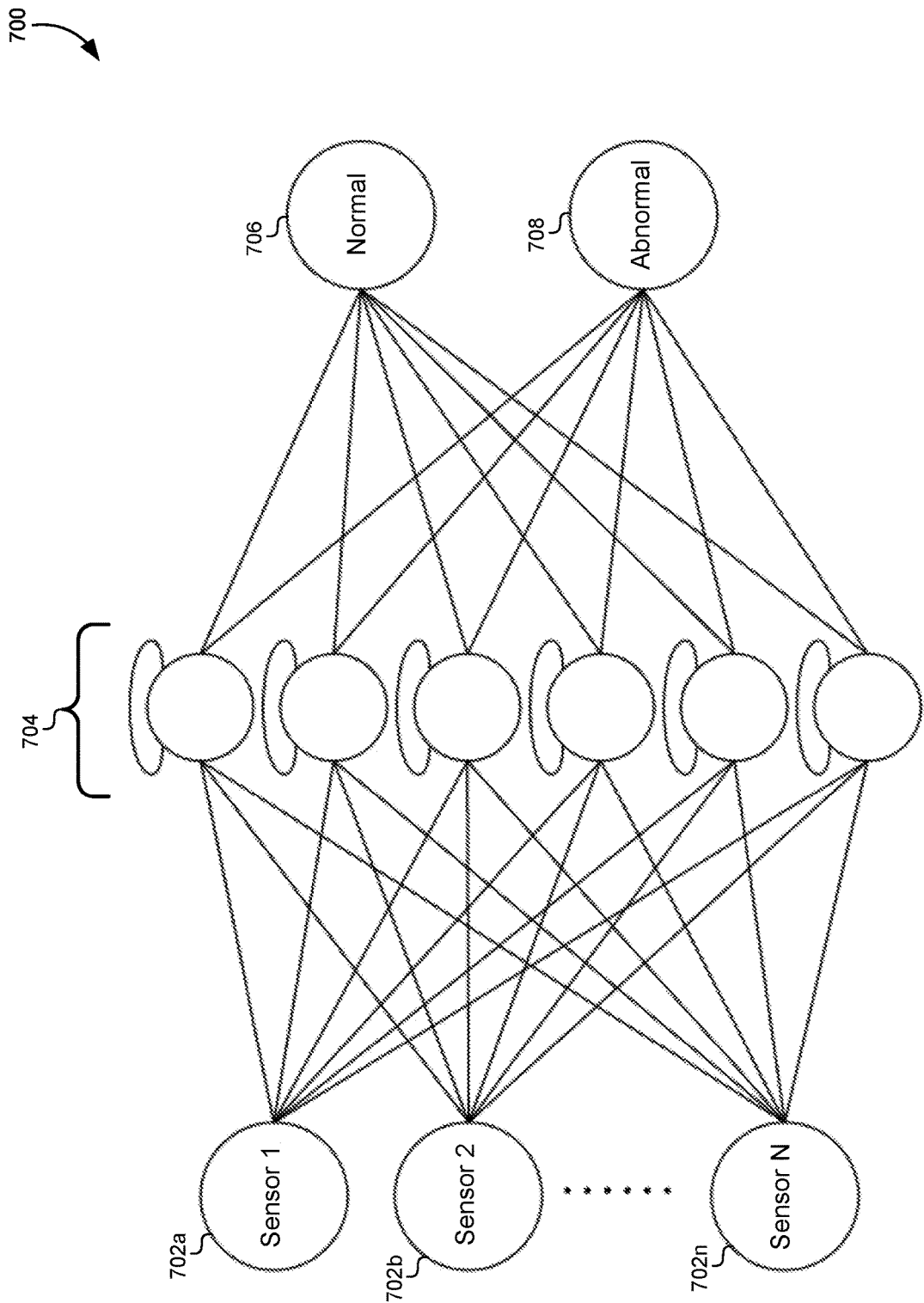
FIG. 7 illustrates a network representation of a model, according to some embodiments.

FIG. 7 illustrates a network representation of a model 700, according to some embodiments. The model 700 may be a neural network having a plurality of inputs 702. As described above, the number, label, and/or type of inputs 702 may correspond to particular sensor outputs on the semiconductor processing system. For example, input 702a may be specifically assigned to a temperature sensor output, and may be provided temperature measurements periodically in a time series as the wafer recipe is executed. Input 702b may be specifically assigned to a pressure sensor output, and may be provided pressure measurements periodically in a time series as the wafer recipe is executed.

The model 700 may also include one or more outputs 706, 708. In some embodiments, the model may include a first output 706 that indicates a normal execution of the wafer recipe. The model may also include a second output 708 that indicates an abnormal execution of the wafer recipe. These outputs may be updated dynamically over time as the wafer recipe is executed and new inputs are provided from the sensor outputs. For example, the abnormal output 708 may indicate that no fault is generated during the first half of the wafer recipe execution. However, as soon as conditions inside the processing chamber evolve into a fault condition, the abnormal output 708 may change to indicate the presence of a fault. Some embodiments may hold the abnormal output 708 in this state for the remainder of the wafer recipe execution or until a fault output is generated in response.

The model 700 may also include one or more hidden layers 704. Although FIG. 7 illustrates only a single layer of hidden nodes 704, this layer 704 may represent a plurality of hidden layers that are not specifically illustrated in FIG. 7 for the sake of clarity. As described above, the number of hidden layers 704 used may depend on the particular model chosen for each embodiment. Therefore, the model 700 may include one layer, two layers, three layers, four layers, five layers, and more if necessary.

Figure 8:
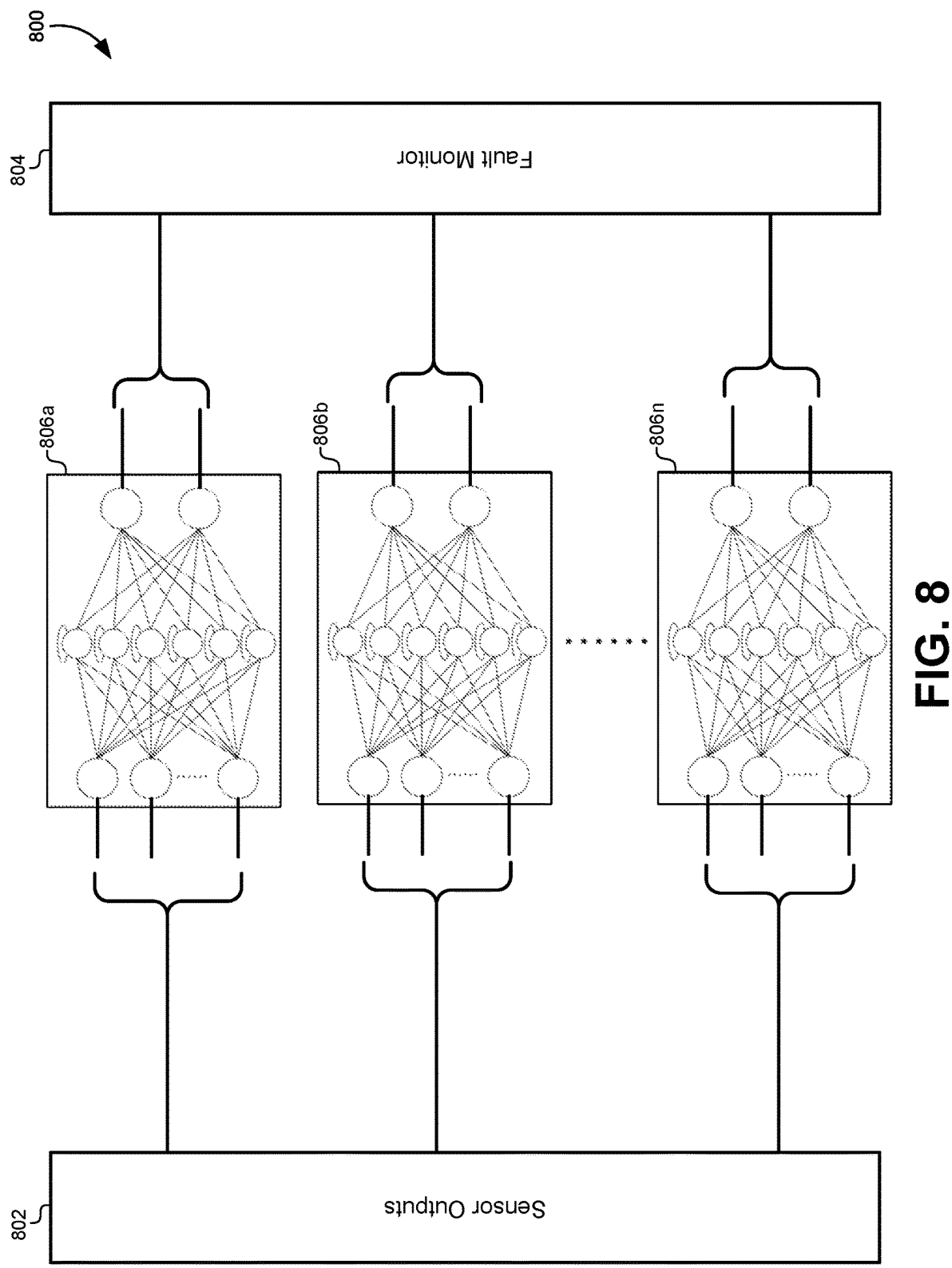
FIG. 8 illustrates a system diagram for providing sensor outputs to a plurality of models simultaneously during the execution of a wafer recipe, according to some embodiments.

FIG. 8 illustrates a system diagram for providing sensor outputs to a plurality of models simultaneously during the execution of a wafer recipe, according to some embodiments. The sensor outputs 802 may be received as sensor measurements directly from the sensors. The processing system may reformat or repackage the sensor outputs 802 as described above such that they are compatible with each of the models 806. The models 806 may each be designed and/or trained using the process described in detail above. The sensor outputs may be fed simultaneously to each of the models 806 such that each of the models 806 operates in parallel to process the sensor outputs 802.

A fault monitor process 804 may operate on the processing system to monitor the outputs of the models 806. As the models 806 begin generating outputs, the fault monitor 804 can continuously determine whether the execution of the wafer recipe is continuing as normal. When any of the models 806 generate a fault on their abnormal output, the fault monitor 804 can recognize the fault condition and generate a fault output in response. As described above, the fault output generated by the fault monitor 804 may include stopping or altering the execution of the wafer recipe, adjusting sensor setpoint values and/or timing constraints, providing a warning or indication to a user or operator, writing the indication of the fault to a data log, labeling a data set as default data set, and/or any other automatic action that may be taken in response to detecting a fault.

Although only three models 806 are illustrated in FIG. 8, this is provided merely by way of example and is not meant to be limiting. Using the automatic process described above, new models may be dynamically added over time as fault conditions are recognized in the wafer manufacturing process. Thus, the method described above can be loaded in the software of the tool of the semiconductor processing system without any models as a starting point. As fault conditions are recognized and data sets are labeled, data sets may be built up over time to train models to recognize those fault conditions. As models are trained, they can be added to the collection of models that are executed in real time as the wafer recipe is executed. In some embodiments, each wafer recipe may include its own set of models that represent known "fingerprints" of fault conditions that have been previously recognized and trained. As described above, each of these models may be refined over time as new data sets are acquired with each execution of the wafer recipe.

Figure 9:
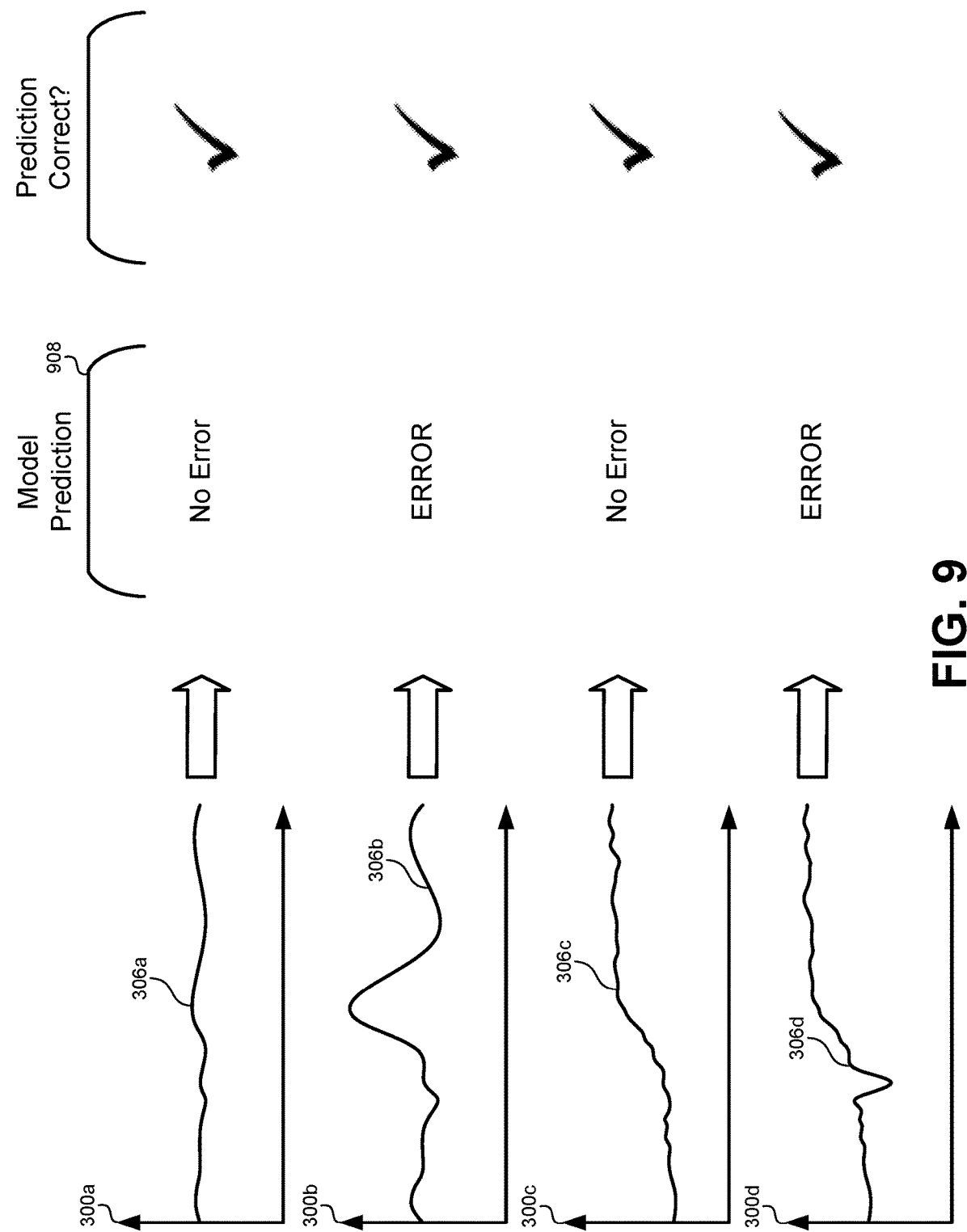
FIG. 9 illustrates a fault detection process using the model-based techniques described herein, according to some embodiments.

FIG. 9 illustrates a fault detection process using the model-based techniques described herein, according to some embodiments. The graphs 300 and the sensor outputs 306 are the same as those illustrated in FIG. 3. However, using the model-based prediction technique 908 has captured the error conditions that are typically missed by the simple threshold based methods. Specifically, the sensor output 306d in graph 300d that generated a "dip" in the sensor output was not extreme enough to violate the lower sensor threshold in FIG. 3. However, as this "dip" causes a fault, this can be recognize as part of a "fingerprint" of sensor outputs that result in a fault condition that is detected by the corresponding model.

FIG. 9 illustrates some of the advantages of the model-based process over previous techniques. First, the model-based process described herein is agnostic to changes in the wafer recipe. Every time the wafer recipe or any other characteristic of the process is changed, the thresholds used for current fault detection methods must be adjusted and tested. However, when using the model-based techniques described herein, changes can be made freely to the wafer recipe without requiring retraining of the models. The models represent a fingerprints of conditions in the processing chamber that cause the fault, and the inputs provided to the processing chamber that cause those conditions are largely irrelevant to this detection process.

Additionally, the model-based processes described herein can be refined to detect small abnormal variations that may occur within a normal operating envelope of sensor readings, but which cause faults. For example, a temperature sensor and a pressure sensor may both be within a normal operating envelope, but the combination of conditions between the temperature and/or pressure may cause a fault. Monitoring individual sensors for these conditions may necessarily miss these types of fault conditions. In contrast, a model-based process holistically captures and analyzes all of the sensor outputs as inputs to the model analysis. Thus small variations and/or process-related correlations of outputs between different sensors may be recognized by a model where they would be missed by existing methods.

Finally, the model-based processes described herein may be executed at runtime and operate during the wafer recipe execution. Faults may thus be detected immediately rather than waiting for any off-line processing when a fingerprint match is detected. Because models can be retrained over time automatically, the system does not require any human interaction or maintenance to continually upgrade and refine the models and fingerprints used for detection. Production data sets from sensor outputs may be used for model training, so no specific training procedures may need to be required after the tool begins operation.

In the foregoing description, for the purposes of explanation, numerous specific details were set forth in order to provide a thorough understanding of various embodiments. It will be apparent, however, to one skilled in the art that embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of the example embodiments will provide those skilled in the art with an enabling description for implementing an example embodiment. It should be understood that various changes may be made in the function and arrangement of elements without departing from the spirit and scope of various embodiments as set forth in the appended claims.

Specific details are given in the foregoing description to provide a thorough understanding of the embodiments. However, it will be understood by one of ordinary skill in the art that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

In the foregoing specification, aspects various embodiments are described with reference to specific embodiments, but those skilled in the art will recognize that the invention is not limited thereto. Various features and aspects of the above-described embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

What is claimed is:

1. A method of detecting and classifying anomalies during semiconductor processing, the method comprising:
   executing a wafer recipe comprising control inputs and timing constraints for a semiconductor processing system to process a semiconductor wafer;
   while the wafer recipe is executing, monitoring a plurality of sensor outputs from a plurality of sensors that monitor conditions associated with the semiconductor processing system;
   providing the plurality of sensor outputs to a plurality of models, wherein the plurality of models are trained to identify when the conditions associated with the semiconductor processing system indicate a fault in the semiconductor wafer, wherein each of the plurality of models are trained to identify specific fault conditions;
   receiving an indication of a fault from at least one of the plurality of models;
   generating a fault output in response to receiving the indication of the fault;
   executing a second wafer recipe to process a second semiconductor wafer;
   while the second wafer recipe is executing, monitoring the plurality of sensor outputs from the plurality of sensors that monitor the conditions associated with the semiconductor processing system;
   providing the plurality of sensor outputs to the plurality of models;
   receiving no indications of a fault from any of the plurality of models;
   receiving an indication that the second semiconductor wafer comprises a fault; and
   accessing data from a threshold number of executions of the second wafer recipe to use as training data after receiving the indication that the second semiconductor wafer comprises the fault.

2. The method of claim 1, further comprising repeatedly executing the second wafer recipe for the threshold number of executions to generate the training data after receiving the indication that the second semiconductor wafer comprises the fault.

3. The method of claim 1, further comprising providing the data from the threshold number of executions of the second wafer recipe to train a new model for recognizing the fault.

4. The method of claim 3, further comprising providing the new model to the plurality of models for processing sensor outputs during subsequent executions of wafer recipes.

5. The method of claim 1, wherein the a model in the plurality of models comprises a machine-learning algorithm comprising a multi-layer neural network.

6. The method of claim 5, wherein the model comprises a recurrent neural network (RNN).

7. The method of claim 6, wherein the RNN comprises a long short-term memory (LSTM).

8. A non-transitory machine-readable medium comprising instructions that, when executed by one or more processors, cause the one or more processors to perform operations comprising:
   executing a wafer recipe comprising control inputs and timing constraints for a semiconductor processing system to process a semiconductor wafer;
   while the wafer recipe is executing, monitoring a plurality of sensor outputs from a plurality of sensors that monitor conditions associated with the semiconductor processing system;
   providing the plurality of sensor outputs to a plurality of models, wherein the plurality of models are trained to identify when the conditions associated with the semiconductor processing system indicate a fault in the semiconductor wafer, wherein each of the plurality of models are trained to identify specific fault conditions;
   receiving an indication of a fault from at least one of the plurality of models;
   generating a fault output in response to receiving the indication of the fault;
   executing a second wafer recipe to process a second semiconductor wafer;
   while the second wafer recipe is executing, monitoring the plurality of sensor outputs from the plurality of sensors that monitor the conditions associated with the semiconductor processing system;
   providing the plurality of sensor outputs to the plurality of models;
   receiving no indications of a fault from any of the plurality of models;
   receiving an indication that the second semiconductor wafer comprises a fault; and
   accessing data from a threshold number of executions of the second wafer recipe to use as training data after receiving the indication that the second semiconductor wafer comprises the fault.

9. The non-transitory machine-readable medium of claim 8, wherein generating the fault output in response to receiving the indication of the fault comprises:
   generating an error message displayed on a user interface of the semiconductor processing system.

10. The non-transitory machine-readable medium of claim 8, wherein the plurality of sensor outputs are provided to the plurality of models in real time as the wafer recipe is executed.

11. The non-transitory machine-readable medium of claim 10, wherein the plurality of models process the plurality of sensor outputs as the wafer recipe is executed.

12. The non-transitory machine-readable medium of claim 8, wherein a model in the plurality of models provides:
   inputs corresponding to each of the plurality of sensor outputs;
   a normal output indicating an absence of a detected fault; and
   an abnormal output indicating a detected fault.

13. The non-transitory machine-readable medium of claim 8, wherein the operations further comprise repeatedly executing the second wafer recipe for the threshold number of executions to generate the training data after receiving the indication that the second semiconductor wafer comprises the fault.

14. The non-transitory machine-readable medium of claim 8, wherein the operations further comprise providing the data from the threshold number of executions of the second wafer recipe to train a new model for recognizing the fault.

15. The non-transitory machine-readable medium of claim 14, wherein the operations further comprise providing the new model to the plurality of models for processing sensor outputs during subsequent executions of wafer recipes.

16. A semiconductor processing system comprising:
a processing chamber;
one or more processors; and
one or more memory devices comprising instructions that, when executed by the one or more processors, cause the one or more processors to perform operations comprising:
  executing a wafer recipe comprising control inputs and timing constraints for the semiconductor processing system to process a semiconductor wafer;
  while the wafer recipe is executing, monitoring a plurality of sensor outputs from a plurality of sensors that monitor conditions associated with the semiconductor processing system;
  providing the plurality of sensor outputs to a plurality of models, wherein the plurality of models are trained to identify when the conditions associated with the semiconductor processing system indicate a fault in the semiconductor wafer, wherein each of the plurality of models are trained to identify specific fault conditions;
  receiving an indication of a fault from at least one of the plurality of models;
  generating a fault output in response to receiving the indication of the fault;
  executing a second wafer recipe to process a second semiconductor wafer;
  while the second wafer recipe is executing, monitoring the plurality of sensor outputs from the plurality of sensors that monitor the conditions associated with the semiconductor processing system;
  providing the plurality of sensor outputs to the plurality of models;
  receiving no indications of a fault from any of the plurality of models;
  receiving an indication that the second semiconductor wafer comprises a fault; and
  accessing data from a threshold number of executions of the second wafer recipe to use as training data after receiving the indication that the second semiconductor wafer comprises the fault.

17. The semiconductor processing system of claim 16, wherein the wafer recipe comprises one or more setpoint temperatures with associated times and one or more setpoint pressures with associated times.

18. The semiconductor processing system of claim 16, the wafer recipe causes the semiconductor processing system to perform an etch process on the semiconductor wafer.

19. The semiconductor processing system of claim 16, wherein the plurality of sensor outputs comprises a temperature in the processing chamber, a pressure in the processing chamber, and measurements of gas flows into the processing chamber.

20. The semiconductor processing system of claim 16, wherein the fault comprises a physical defect in the semiconductor wafer introduced by conditions in the processing chamber.

* * * * *